United States Patent [19]
Claasen-Vujcic

[11] Patent Number: 5,689,188
[45] Date of Patent: Nov. 18, 1997

[54] MAGNETIC RESONANCE APPARATUS

[75] Inventor: Tatjana Claasen-Vujcic, Zoetermeer, Netherlands

[73] Assignee: U.S. Philips Corporation, New York, N.Y.

[21] Appl. No.: 632,236

[22] Filed: Apr. 15, 1996

[30] Foreign Application Priority Data

Apr. 18, 1995 [EP] European Pat. Off. ............. 95200963

[51] Int. Cl.$^6$ .................................................. G01V 3/00
[52] U.S. Cl. .................................. 324/318; 324/322
[58] Field of Search .................................. 324/318, 322, 324/314, 307, 309; 128/653.5

[56] References Cited

U.S. PATENT DOCUMENTS

| | | | |
|---|---|---|---|
| 4,743,852 | 5/1988 | Ikeda | 324/318 |
| 4,783,641 | 11/1988 | Hayes et al. | 324/318 |
| 5,445,153 | 8/1995 | Sugie et al. | 324/318 |

FOREIGN PATENT DOCUMENTS

| | | |
|---|---|---|
| 0141383 | 5/1985 | European Pat. Off. |
| 0409292 | 1/1996 | European Pat. Off. |

*Primary Examiner*—Louis M. Arana
*Attorney, Agent, or Firm*—Jack D. Slobod

[57] ABSTRACT

Magnetic apparatus resonance includes a mainly cylindrical RF coil (9) which has a central axis (35) extending in its longitudinal direction and comprises a number of axial conductor elements (37) which extend parallel to the central axis across a mainly cylindrical surface, and also comprises end conductor elements which extend around the central axis near the ends of the axial conductor elements. The axial conductor elements (37) are distributed across the circumference of the cylinder in such a manner that they occupy predetermined positions relative to a zero position (39). The RF coil (9) is arranged to generate a substantially sinusoidal current distribution as a function of the position of the axial conductor elements (37) on the circumference of the cylinder, expressed as the angle ($\alpha$) of this position relative to the zero position (39), in order to enable a substantially uniform RF magnetic field, oriented perpendicularly to the cylinder axis (35), to be generated and/or received. Each end conductor element consists of a number of loop conductor segments (43), each of which interconnects the corresponding ends of two axial conductor elements (37). At least some of the axial conductor elements (37) constitute, together with the loop conductor segments (43) connected to their ends, a coil element (44) which is composed of a number of turns of an elongate electric conductor (45), all coil elements thus formed being electrically connected in series.

20 Claims, 6 Drawing Sheets

MAGNETIC RESONANCE APPARATUS

BACKGROUND OF THE INVENTION

1. Field of the Invention

The invention relates to a magnetic resonance apparatus, including a mainly cylindrical RF coil which has a central axis extending in its longitudinal direction a number of axial conductor elements which extend parallel to the central axis across a mainly cylindrical surface, and end conductor elements which extend around the central axis near the ends of the axial conductor elements, the axial conductor elements being distributed across the circumference of the cylinder in such a manner that they occupy predetermined positions relative to a zero position, and the RF coil being arranged to generate a substantially sinusoidal current density distribution as a function of the position of the axial conductor elements on the circumference of the cylinder, expressed as the angle of this position relative to the zero position, in order to enable a substantially uniform RF magnetic field, oriented perpendicularly to the cylinder axis, to be generated and/or received.

2. Description of the Related Art

An example of such a magnetic resonance apparatus is known from EP-B-0 141 383. Capacitive elements are included in the axial conductor elements in the known apparatus. The RF coil may be represented as a ladder network consisting of a number of identical elements, each of which comprises a combination of self-inductances and capacitances. The values of the capacitances are determined mainly by the values of the capacitors included in the axial conductor elements, the values of the self-inductances being determined mainly by the self-inductances of the conductors constituting the RF coil and by the mutual inductances between these conductors. The resonance frequency of the ladder network, determining the frequency at which the RF coil can be used, can be determined by the designer by suitably choosing the values of the capacitances and the self-inductances in said elements of the network. As is known, the resonance frequency is inversely proportional to the square root of the product of the self-inductance and the capacitance. In the known apparatus the range of values wherefrom the resonance frequency can be chosen is limited because the value of the capacitance cannot be arbitrarily high and for given dimensions of the RF, coil the value of the self-inductance substantially cannot be varied. Therefore, the known apparatus is not suitable for so-called low-field MRI where the RF coil must be tuned to a comparatively low frequency. Examinations based on the so-called Overhauser effect also utilize low frequencies; for example, see EP-A-0 409 292. For such measurements the desired resonance frequency of the RF coil may be of the order of magnitude of some hundreds of kHz.

SUMMARY OF THE INVENTION

It is an object of the invention to provide an apparatus of the kind set forth in which the resonance frequency of the RF coil can be chosen comparatively independently of the dimensions of this coil, so that comparatively low resonance frequencies are also feasible. To achieve this, the apparatus in accordance with the invention is characterized in that each end conductor element consists of a number of loop conductor segments each loop conductor segment interconnecting the corresponding ends of two axial conductor elements, at least some of the axial conductor elements forming, together with the loop conductor segments connected to their ends, a coil element which is composed of a number of turns of an elongate electric conductor, all coil elements thus formed being electrically connected in series. As a result of these steps the number of coil elements and the number of turns per coil element can be chosen at will. Consequently, the self-inductance of the RF coil, being dependent on these parameters, can also be chosen at will. The required sinusoidal current density distribution can then be readily established by suitably choosing the positions of the axial conductor elements in dependence on the number of turns wherefrom each of these conductor elements forms part. A further advantage consists in that, if desired, the positions of the axial conductor elements can be chosen so that given parts of an object arranged within the RF coil become more readily accessible during examinations by means of the MR apparatus.

A preferred embodiment of the apparatus in accordance with the invention is characterized in that the series connection of coil elements is connected to a capacitive element via at least one of its ends. It has been found that an RF coil constructed in conformity with the invention can be tuned by means of only a single capacitive element, for example a variable capacitor. The construction is, therefore, substantially simpler than that of the known RF coil which requires a large number of capacitive elements.

The coil elements can be formed, individually or together, as conductors on a preformed or flexible support of an electrically insulating material. To this end use can be made of techniques which are commonly used for the manufacture of printed circuit boards (PCBs). A preferred embodiment of the apparatus in accordance with the invention, however, is characterized in that each coil element is formed as a self-supporting sub-coil which is wound from at least one electrically conductive wire provided with an electrically insulating sheath. This embodiment of the RF coil can be very simply manufactured and it is particularly easy to modify the design, for example in respect of the number of turns per coil element, the number of coil elements and the positions of the axial conductor elements. The simplest construction is obtained when the RF coil consists of two coil elements which are diametrically arranged relative to the central axis.

The desired sinusoidal current distribution can be achieved in various ways. An embodiment of the apparatus in accordance with the invention which utilizes a first way is characterized in that the situation of the turns in each coil element is chosen so that each axial conductor element forms part of a number of turns which is proportional to the absolute value of the sine of the angle indicating the position of the relevant axial conductor element relative to the zero position. In this embodiment the positions of the axial conductor elements can be chosen comparatively arbitrarily, so that the RF coil may comprise a number of openings whose position can be suitably chosen, for example in such a manner that optimum accessibility of an object to be measured (for example, a patient to be examined) and arranged within the RF coil is achieved. An embodiment which utilizes a second way of realising the sinusoidal current distribution is characterized in that the situation of the turns in each coil element is chosen so that each axial conductor element forms part of the same number of turns, and that the distance between successive axial conductor elements in the direction of the circumference of the cylinder decreases as the absolute value of the angle between the axial conductor elements and the zero position increases, the arrangement being such that the axial current density in the RF coil is substantially proportional to the sine of the angle indicating the position in the RF coil with respect to the zero position. This embodiment offers the advantage that the radial dimension of the RF coil is small (equal to the thickness of a single conductor), which may be of importance if only limited space is available for the RF coil.

In many cases rotation of the transmitted and/or received RF magnetic field is desirable. In such cases use is often made of a so-called quadrature coil system which comprises two RF coils which generate and/or receive mutually perpendicularly oriented RF magnetic fields and which are excited and/or read out with a mutual phase difference of 90°. An embodiment of the apparatus in accordance with the invention which is suitable for this purpose is characterized in that the apparatus comprises a first and a second RF coil, the first and second RF coils essentially having the same construction and being concentrically arranged around the central axis in such a manner that the second RF coil has been rotated through an angle of 90° around the central axis relative to the first RF coil, the first and second RF coils being connected to respective terminals of an RF transmitter and/or receiver device arranged to supply and/or receive RF signals with a mutual phase difference of 90° in order to enable mutually perpendicularly oriented RF magnetic fields with a phase difference of 90° to be generated and/or received. The first and second RF coils preferably have the same diameter.

These and other aspects of the invention will be apparent from and elucidated with reference to the embodiments described hereinafter.

Figure 1:
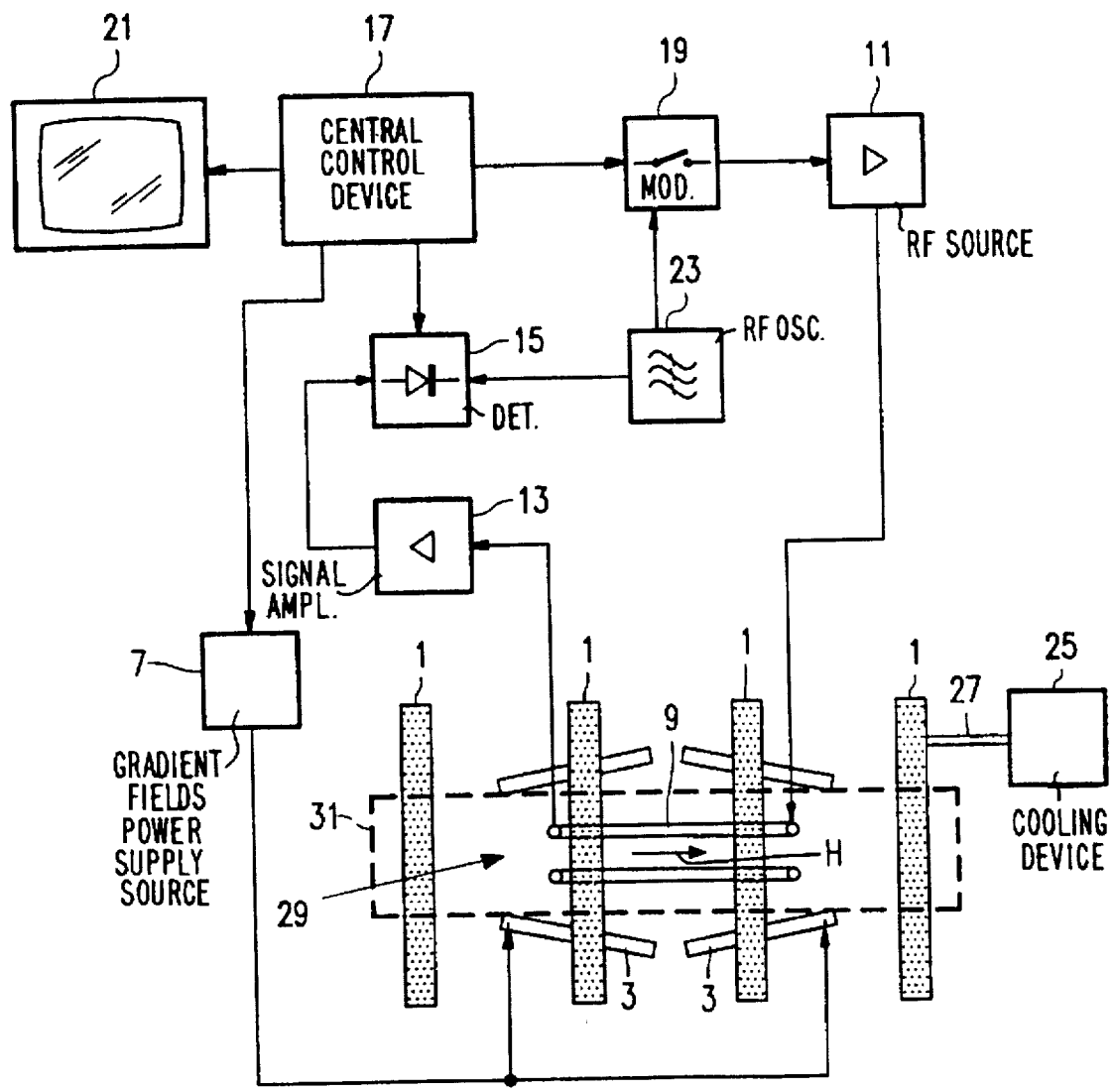
FIG. 1 shows diagrammatically an embodiment of a magnetic resonance apparatus in accordance with the invention.

The magnetic resonance apparatus which is diagrammatically shown in FIG. 1 comprises a first magnet system 1 for generating a steady magnetic field H, a second magnet system 3 for generating magnetic gradient fields, and a power supply source 7 for the second magnet system 3. A radio frequency (RF) coil 9 serves to generate an RF magnetic alternating field; to this end, it is connected to an RF source 11. The RF coil 9 can also be used for detection of spin resonance signals generated by the RF transmitted field in an object to be examined (not shown); to this end, it is connected to an RF receiver device comprising a signal amplifier 13. The output of the signal amplifier 13 is connected to a detector circuit 15 which is connected to a central control device 17. The central control device 17 also controls a modulator 19 for the RF source 11, the power supply source 7 and a monitor 21 for display. An RF oscillator 23 controls the modulator 19 as well as the detector 15 processing the measurement signals. For cooling of the magnet coils of the first magnet system 1 there is provided a cooling device 25 comprising cooling ducts 27. The RF coil 9, arranged within the magnet systems 1 and 3, encloses a measurement space 29 which is large enough to accommodate a patient to be examined, or a part of a patient to be examined, for example the head and the neck, in an apparatus for medical diagnostic measurements. Thus, a steady magnetic field H, gradient fields selecting object slices, and a spatially uniform RF alternating field can be generated within the measurement space 29. The RF coil 9 can combine the functions of transmitter coil and measuring coil. Alternatively, different coils can be used for the two functions, for example measuring coils in the form of surface coils. Hereinafter, the RF coil 9 will usually be referred to only as the transmitter coil. For the use of the coil as a measuring coil the same considerations apply in accordance with the reciprocity theorem. If desired, the coil 9 may be enclosed by an RF field shielding Faraday cage 31.

Figure 2A:
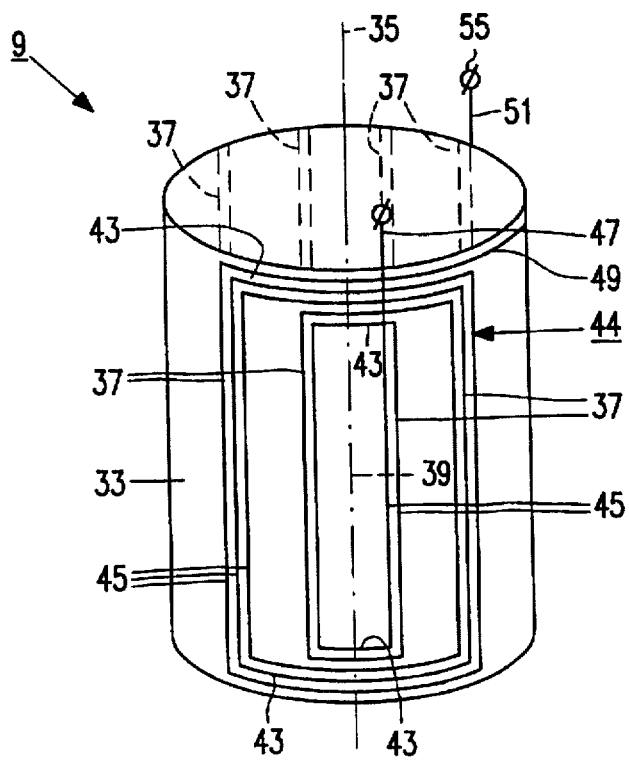
FIG. 2A is a diagrammatic perspective view of a first embodiment of an RF coil for the apparatus shown in FIG. 1.
Figure 2B:
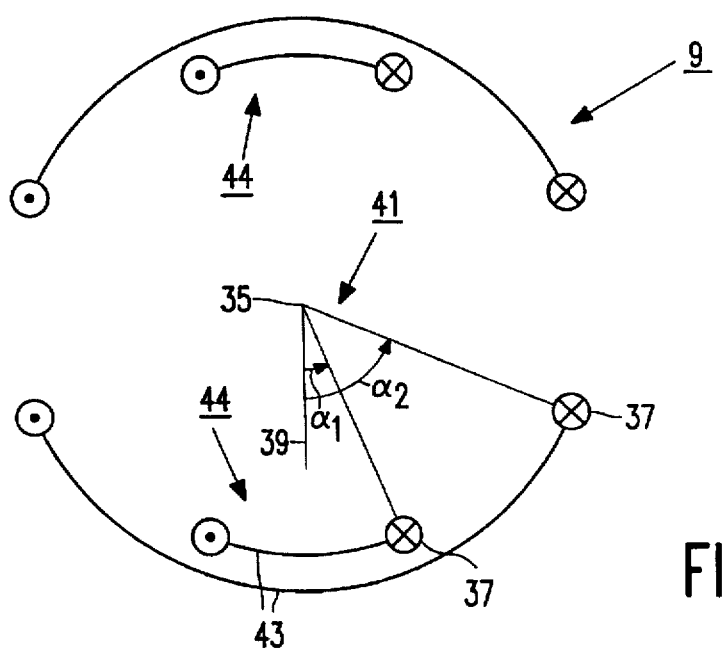
FIG. 2B is a diagrammatic view in the axial direction of the RF coil shown in FIG. 2A.

FIGS. 2A and 2B are a diagrammatic perspective view and an axial view, respectively, of a first embodiment of the RF coil 9 of the apparatus shown in FIG. 1. The RF coil 9 has a cylindrical shape and may be arranged, for example on an equally cylindrical coil former 33. The cylinder has a central axis 35 which is denoted by a dash-dot line. The RF coil 9 comprises a number of axial conductor elements 37 which extend parallel to the central axis 35 across the cylinder surface and which are regularly distributed across the cylinder surface in the present embodiment in such a manner that they pair-wise occupy symmetrical positions with respect to a zero position 39. This zero position is denoted by a dashed line on the surface of the coil former 33 in FIG. 2A and as a 0° axis of a polar coordinate system 41 in FIG. 2B. In the coordinate system 41 the position of each axial conductor element 37 can be indicated by means of the angle α of this position relative to the zero position 39. In FIG. 2B the angle for two of the axial conductor elements 37 is denoted by the references $\alpha_1$ and $\alpha_2$, respectively. Two axial conductor elements 37, together constituting a pair, are thus present in the positions α and −α. The ends of axial conductor elements 37 which are situated at the same end of the cylinder (so both at the top or both at the bottom in FIG. 2A) will be referred to hereinafter as corresponding ends. The corresponding ends of each pair of axial conductor elements 37 are interconnected by means of a loop conductor segment 43. The loop conductor segments 43 at one end of the cylinder together constitute an end conductor element which, as appears from FIG. 2B, need not necessarily be a closed loop.

In conjunction with the loop conductor segments 43 connected to their ends, some of the axial conductor elements 37 constitute a coil element 44 which is composed as a number of turns of an elongate electric conductor 45. The electric conductor 45 may be a conductor track on a flat, electrically insulating substrate which is formed, for example in the manner customarily used for the manufacture of printed circuit boards (PCBs), by selective etching of a copper layer provided on the substrate, followed by bending so as to obtain the cylindrical shape. Preferably, however, the conductor 45 consists of an electrically conductive wire provided with an insulating sheath, or a so-called litze wire formed from a bundle of such wires, the coil elements 44 being wound therefrom as self-supporting sub-coils in the manner customarily used for the winding of coils. The axial conductor elements 37 and loop conductor segments 43 situated to the same side of the cylinder axis 35 are preferably wound together, first the inner part of the coil element 44 being wound, starting from a first coil lead-out 47, and subsequently the parts which are situated further outwards. In FIG. 2A a first coil element 44 formed in this manner is visible at the front of the coil former 33. The outer part of the first coil element 4 terminates in a second coil lead-out 49. A similarly formed second coil element 44 is situated at the rear of the coil former 33. The positions of the axial conductor elements 37 of said second coil element are denoted by dashed lines. The second coil lead-out 49 of the first coil element 44 is electrically connected to the first coil lead-out (not visible) of the second coil element. This connection can be established by winding the second coil element 44 immediately after the first coil element, using the same wire, or by winding the two coil elements separately and connecting the second coil lead-out 49 of the first coil element to the first coil lead-out of the second coil element, for example by soldering, during mounting on the coil former 33. It is alternatively possible to wind the parts which are shown as the inner and the outer part of the coil element 44 in FIG. 2A as separate, self-supporting coil elements and to interconnect all coil elements associated with an RF coil 9 only upon assembly. The RF coil 9 consists of two self-supporting coil elements 44 which are identical and which, therefore, each comprise half the number of axial conductor elements 37 of the RF coil. These two coil elements are diametrically arranged relative to the central axis 35 and are electrically connected in series. The second coil element 44 terminates in a second coil lead-out 51 which is fed out as shown in FIG. 2A. The ends of the first coil lead-out 47 of the first coil element 44 and the second coil lead-out 51 of the second coil element constitute a first connection point 53 and a second connection point 55, respectively, of the RF coil 9.

As appears from the foregoing, the rams of each coil element 44 together constitute the loop conductor segments 43 and the axial conductor elements 37 of the relevant coil element. The situation of the turns in each of the coil elements 44 is chosen so that each axial conductor element 37 forms part of a number of turns which is proportional to the absolute value of the sine of the angle α indicating the position of the relevant axial conductor element 37 relative to the zero position 39. Because all turns of each coil element 44 are electrically connected in series, the total current in each axial conductor element 37 is proportional to sin α, the sign of sin α indicating the current direction. Thus, the RF coil 9 produces an approximately sinusoidal current density distribution in the axial conductor elements 37. The approximation is better, of course, as the number of axial conductor elements 37 is larger. In the embodiment shown this number equals eight and it has been found in practice that this offers a suitable approximation of a sinusoidal current density distribution. If desired, the number of axial conductor elements 37 may be increased. In FIG. 2B the current direction in the axial conductor elements 37 at a given instant is indicated in a conventional manner. A cross means that the current is directed away from the observer and a dot indicates that the current is directed towards the observer.

Figure 3:
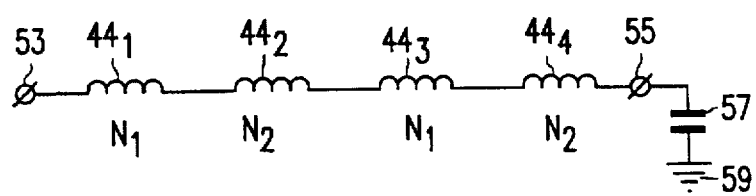
FIG. 3 shows a circuit diagram of the RF coil shown in the FIGS. 2A and 2B.

FIG. 3 shows an electric circuit diagram of the described RF coil 9. In the operating condition the first connection point 53 is connected to a terminal of the RF source 11 or the signal amplifier 13 (FIG. 1). The second connection point is connected, via a capacitive element 57, to a ground terminal 59 whereto the second connections (not shown) of the RF source 11 and the signal amplifier 13 are also connected. The four series-connected parts of the coil elements 44 are successively, starting from the first connection point 53, the inner and the outer part, $44_1$ and $44_2$, of the first coil element, and the inner and the outer part, $44_3$ and $44_4$, of the second coil element. The number of turns of each part, also shown in FIG. 3, amounts to $N_1$, $N_2$, $N_1$, $N_2$ for the four parts $44_1$, $44_2$, $44_3$ and $44_4$, respectively, where:

$$N_1 = A |\sin \alpha_1| \text{ and } N_2 = A |\sin \alpha_2|. \tag{1}$$

A is a proportionality factor. $N_1$ and $N_2$ in a practical embodiment amounted to 8 and 20, respectively, and $\alpha_1$ and $\alpha_2$ amounted to 21.68° and 67.5°, respectively. The self-inductance of each coil element 44 is dependent inter alia on the number of turns and on the mutual inductances between the parts of the coil elements, so that the total self-inductance L of the RF coil 9 can be influenced by suitably choosing the construction of the coil elements. The capacitive element 57 connected to the second connection point 55 has a capacitance C and constitutes a resonant circuit in conjunction with the series connection of coil elements 44. The capacitive element 57 may be, for example a fixed or a variable capacitor. The resonance frequency of the series connection can be tuned to a desired value by a suitable choice of the values of L and C. Any value within a very large resonance frequency range is feasible in principle, because the values of C and L can be chosen practically at will within very broad limits. Therefore, the RF coil 9 can be readily tuned to a desired frequency. Evidently, the RF source 11 and the signal amplifier 13 are tuned to the same frequency.

Figure 4A:
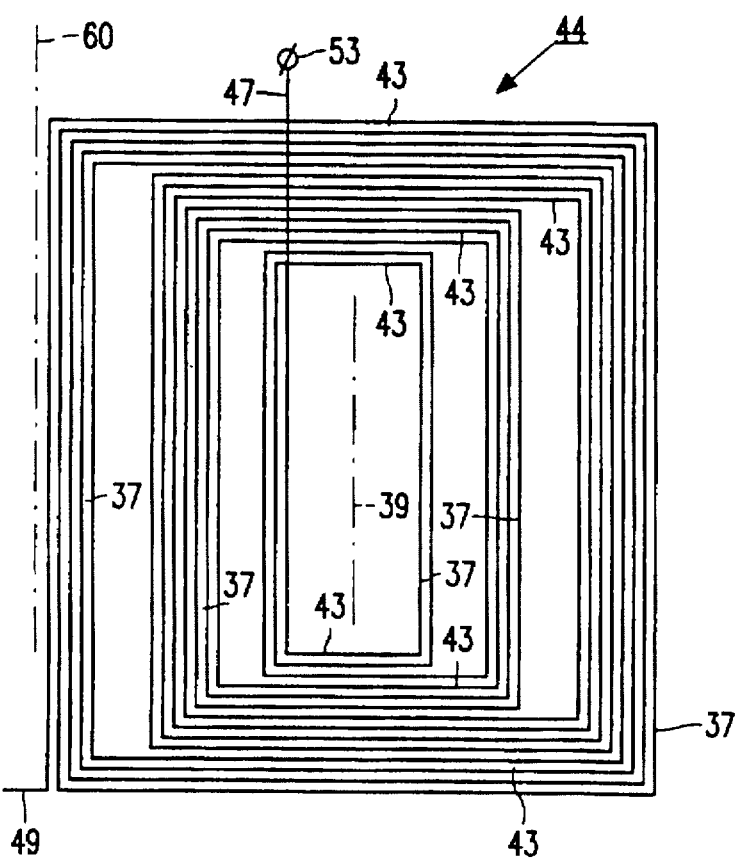
FIG. 4A is a diagrammatic side elevation of a coil element of a second embodiment of an RF coil for the apparatus shown in FIG. 1.
Figure 4B:
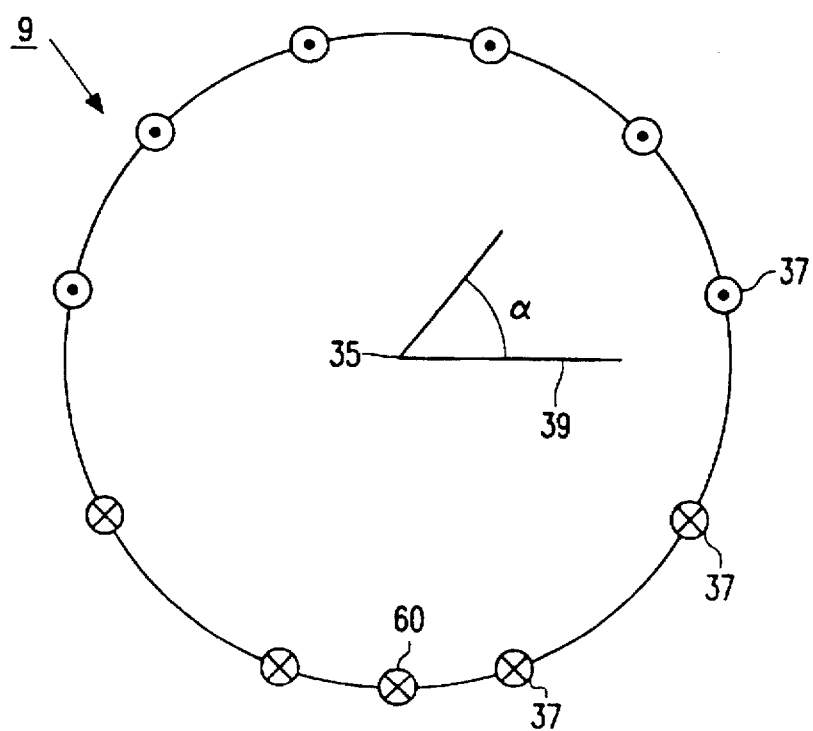
FIG. 4B is a diagrammatic axial view of an RF coil composed of coil elements of the type shown in FIG. 4A.

In the embodiment described with reference to the FIGS. 2A and 2B the coil elements 44 are situated symmetrically relative to the zero position 39. This means that for each axial conductor element 37 in a position α an axial conductor element is present in a position −α, and that both said axial conductor elements form part of the same number of turns. However, this is not an absolute condition as will be explained hereinafter on the basis of a second embodiment hereinafter. FIG. 4A is a view of a coil element 44 of the second embodiment and FIG. 4B is a view in the axial direction of an RF coil 9 manufactured using such coil elements. Use is made of the same reference numerals as used in the FIGS. 2A and 2B. The coil element is again wound from the inside outwards as a self-supporting construction, starting from a first coil lead-out 47 and terminating with a second coil lead-out 49. The axial conductor elements 37 successively form part of eight, four, two, three, seven and five turns (from right to left in FIG. 4A). The second coil lead-out 49 is connected to a first coil lead-out of a second coil element which is the mirror image of the coil element 44 shown in FIG. 4A, the symmetry line being denoted by the reference 60. Therefore, the second coil element comprises at its extreme right-hand side an axial conductor element comprising five conductors which constitutes, together with the extreme left-hand axial conductor element 37 of the coil element 44 shown, a combined axial conductor element comprising ten conductors. The combination of these two coil elements results in an RF coil 9, an axial view of which is shown diagrammatically in FIG. 4B. The positions of the axial conductor elements 37 are chosen so that the number of conductors in each axial conductor element (being equal to the number of turns wherefrom the relevant axial conductor element forms part) is proportional to the absolute value of the sine of the angle $\alpha$ indicating the position relative to the zero position 39. The coil element 44 of FIG. 4A thus deviates from that shown in FIG. 2A in that the axial conductor elements 37 are not pair-wise symmetrical with respect to the zero position 39 and in that one end of some of the axial conductor elements is connected to more than one loop conductor segment 43. The latter, however, is also possible if the axial conductor elements 37 are pair-wise symmetrical with respect to the zero position 39, as will be illustrated hereinafter with reference to FIG. 5.

Figure 5:
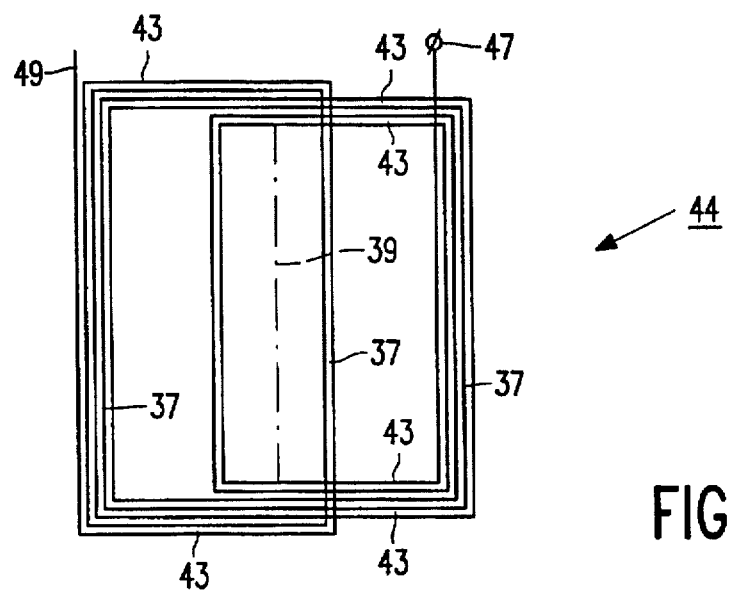
FIG. 5 is a diagrammatic view of a coil element of a third embodiment of an RF coil for the apparatus shown in FIG. 1.

FIG. 5 shows a third embodiment of a coil element 44, the same reference numerals being used again. This coil element is wound in the same way as the foregoing embodiments and comprises four axial conductor elements 37 which are situated pair-wise symmetrically relative to the zero position and which comprise five, two, two and five conductors, respectively, viewed from left to right. At the top as well as at the bottom of FIG. 5 there are provided three loop conductor segments 43 which interconnect corresponding ends of the first and the third, the first and the fourth, and the second and the fourth axial conductor element 37, respectively. It appears from the embodiments shown that the shape of the coil elements 44 can be chosen at random to a high degree. Therefore, various properties of the RF coil 9 to be formed can be optimized substantially independently. Such properties are, for example the locations of the openings between the axial conductor elements 37 (with a view to accessibility of the object to be arranged within the RF coil), the self-inductance and the coil quality.

Figure 6A:
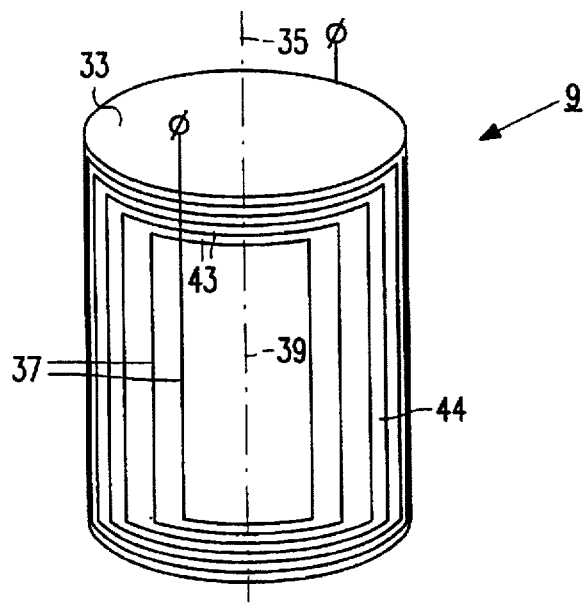
FIG. 6A is a diagrammatic perspective view of a second embodiment of an RF coil for the apparatus shown in FIG. 1.
Figure 6B:
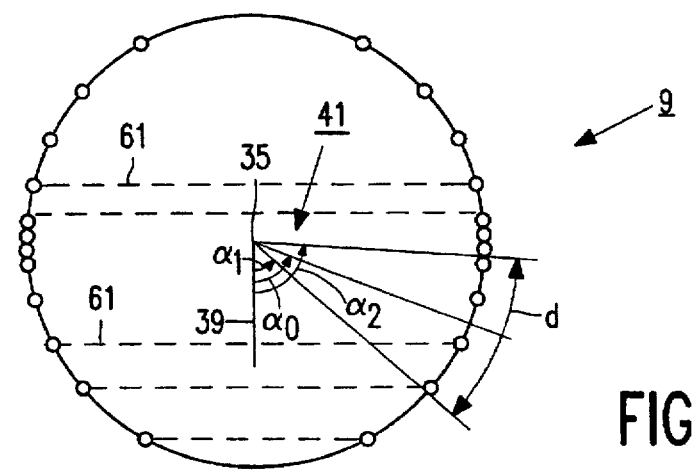
FIG. 6B is a diagrammatic axial view of the RF coil shown in FIG. 6A.

FIGS. 6A and 6B are a diagrammatic perspective view and an axial view, respectively, of a fourth embodiment of the RF coil 9 of the apparatus shown in FIG. 1. Corresponding elements are again denoted by the same reference numerals as used in the FIGS. 2A and 2B. The RF coil 9 in the present embodiment again comprises two coil elements 44 which may be formed by using the same techniques as for the coil elements of the preceding embodiments and which are electrically connected in series. Each coil element 44 consists of a number of electrically series-connected turns. However, each axial conductor element 37 now forms part of the same number of turns, being one turn in the embodiment shown. Evidently, this number may also be two or more. Some of the axial conductor elements 37, belonging to the same turn, are interconnected by way of a dashed line 61 for the sake of clarity in FIG. 6B. The distance between the axial conductor elements 37 in the direction of the cylinder circumference decreases as the absolute value of the angle $\alpha$ between the axial conductor elements and the zero position 39 increases. Consequently, the axial current density in the RF coil 9 increases as the absolute value of sin $\alpha$ increases. The axial current density J is to be understood to mean herein the axial current $I_{ax}$ per unit of distance measured in the circumferential direction of the cylinder. If R is the radius of the cylinder on which the axial conductor elements 37 are arranged and if the angle $\alpha$ is measured in radians, the distance d between two positions $\alpha_1$ and $\alpha_2$ (see FIG. 6B) equals $R(\alpha_2-\alpha_1)$. The axial current density J associated with a position $\alpha_0$ halfway between $\alpha_1$ and $\alpha_2$ then equals:

$$J = \frac{\sum\limits_{\alpha_1}^{\alpha_2} I_{ax}}{d} \qquad (2)$$

Because the distance between the axial conductor elements 37 decreases as the absolute value of $\alpha$ increases, there will be more axial conductor elements per unit of distance as $\alpha$ is larger. As has already been explained, all axial conductor elements 37 comprise the same number of conductors, so that each axial conductor element carries the same current $I_{ax}$. In the formula (2) the value of the sum, therefore, is proportional to the number of axial conductor elements 37 extending over the distance d. If d is kept constant, therefore, J is proportional to this number. If the distance between successive axial conductor elements 37 is inversely proportional to the absolute value of sin $\alpha$, the number of axial conductor elements 37 over a fixed distance d will be proportional to |sin $\alpha$|. The variation of the axial current density J is then sinusoidal. Because the axial conductor elements 37 are situated in discrete positions, the sinusoidal current distribution, of course, will only be approximated, the approximation being better as the number of turns per coil element 44 is larger. It has been found that the embodiment shown, comprising six turns per coil element 44, offers a suitably usable approximation.

Figure 7:
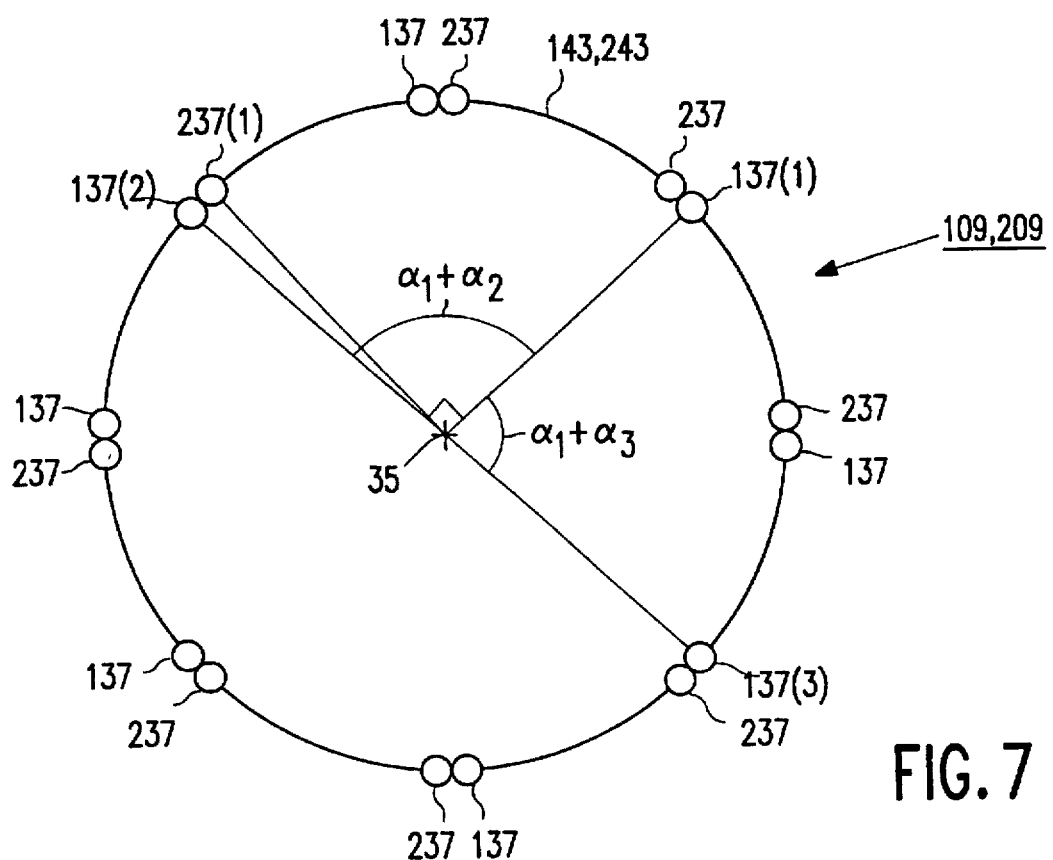
FIG. 7 is a diagrammatic axial view of a first embodiment of a quadrature coil system for the apparatus shown in FIG. 1.

FIG. 7 shows a combination of a first RF coil 109 and a second RF coil 209 which is suitable for use in an apparatus as shown in FIG. 1. The first and second RF coils, 109 and 209, are, for example of the type described with reference to the FIGS. 2A and 2B. They are concentrically arranged around the common central axis 35, but the second RF coil 209 has been rotated through an angle of 90° around said axis with respect to the first RF coil 109. This means that corresponding axial conductor elements 137 and 237 of the first RF coil 109 and the second RF coil 209, respectively, exhibit a difference in position of 90°. By way of example, the positions of two corresponding axial conductor elements 137(1) and 237(1) relative to one another are shown in FIG. 7.

In order to obtain optimum homogeneity of the magnetic field generated by an RF coil, it is desirable generally speaking to distribute the axial conductor elements as regularly as possible across the cylinder circumference. If an RF coil comprises eight axial conductor elements, such as the RF coils 109 and 209, the difference in position between successive axial conductor elements of the same RF coil should, therefore, preferably amount to 45°. This means that at a distance of 90° from the axial conductor element 137(1) of the first RF coil 109 another axial conductor element 137(2) of the same RF coil should be arranged. A conflict arises because, as has already been described above, the axial conductor element 237(2) of the second RF coil 209 should also be situated in that position. This conflict could be solved by choosing the diameter of the second RF coil 209 to be larger than that of the first RF coil 109. However, this solution has a number of drawbacks. First of all, the thickness of the overall construction is thus increased, so that it occupies more space. Secondly, the two RF coils 109 and 209 should then have different constructions; this has a cost-increasing effect. Thirdly, arranging axial conductor elements 137 and 237 of the RF coils 109 and 209 one over the other causes a comparatively strong capacitive coupling between the RF coils. This coupling is undesirable and would have to be reduced, for example by inserting spacers between the coils, so that the total diameter would be further increased. Therefore, the embodiment shown opts for a solution where the axial conductor elements 137 and 237 are not exactly regularly distributed across the circumference of the RF coils 109 and 209. As a result, the angle $\alpha_1+\alpha_2$ between the axial conductor elements 137(1) and 137(2) is slightly larger than 90° and the angle $\alpha_1+\alpha_3$ between the axial coil elements 137(1) and 137(3) is slightly smaller. Thus, the two RF coils 109 and 209 are slid one into the other as if it were and occupy comparatively little space. The second RF coil 209 may have the same diameter as the first RF coil 109 and the above drawbacks are avoided. The capacitive coupling between directly adjacent axial conductor elements, such as 137(1) and 237(1), is substantially less than that between axial conductor elements arranged one over the other. The deviation between the position of the axial conductor elements 137 and 237 and the "ideal" position can be readily compensated for by adapting the number of conductors in each of these elements. This can be readily achieved as has been explained with reference to the examples. When wound one over the other, the loop conductor segments 143 and 243 could still cause a given capacitive coupling. If this were problematic, the loop conductor segments could be separated from one another by spacers (not shown), be it that the diameter of the construction would then be slightly increased. In order to reduce the capacitive coupling it is alternatively possible to wind the loop conductor segments 143 and 243 adjacent one another, so that the dimension of the construction is slightly increased in the axial direction.

Figure 8:
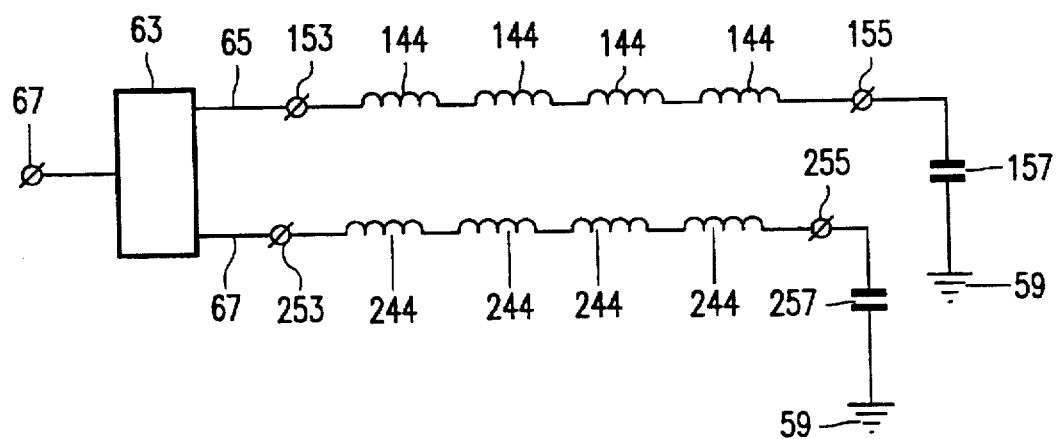
FIG. 8 shows a circuit diagram of the quadrature coil system shown in FIG. 7, and FIGS. 9 and 10 show a diagrammatic axial view and a circuit diagram, respectively, of a second embodiment of a quadrature coil system for the apparatus shown in FIG. 1.

FIG. 8 shows the circuit diagram of the RF coils 109 and 209. The circuit diagram of each RF coil 109, 209 corresponds to that of the single RF coil 9 shown in FIG. 3. The RF transmitter device 11 and/or the RF receiver device whereto the two RF coils 109, 209 are connected, however, now also comprises a known hybrid network 63 which comprises a first connection 65, a second connection 67 and a third connection 69. The hybrid network 63 may be arranged to split an RF signal, presented to its third connection 69 by the transmitter device 11, into a first and a second RF signal exhibiting a phase difference of 90° and to make these signals available via the first connection 65 and the second connection 67, respectively. It may also be arranged to receive a first signal and a second signal via its first connection 65 and its second connection 67, respectively, to subject one of these signals to a 90° phase shift, and to combine the signals subsequently so as to apply the combined signal to the signal amplifier 13 of the RF receiver device via its third connection 69. The first and second RF coils 109, 209 thus connected to the RF transmitter and/or receiver device together constitute a quadrature coil system capable of generating and/or receiving mutually perpendicularly oriented RF magnetic fields with a phase difference of 90°. A circularly polarized RF magnetic field can thus be generated and/or received.

Figure 9:
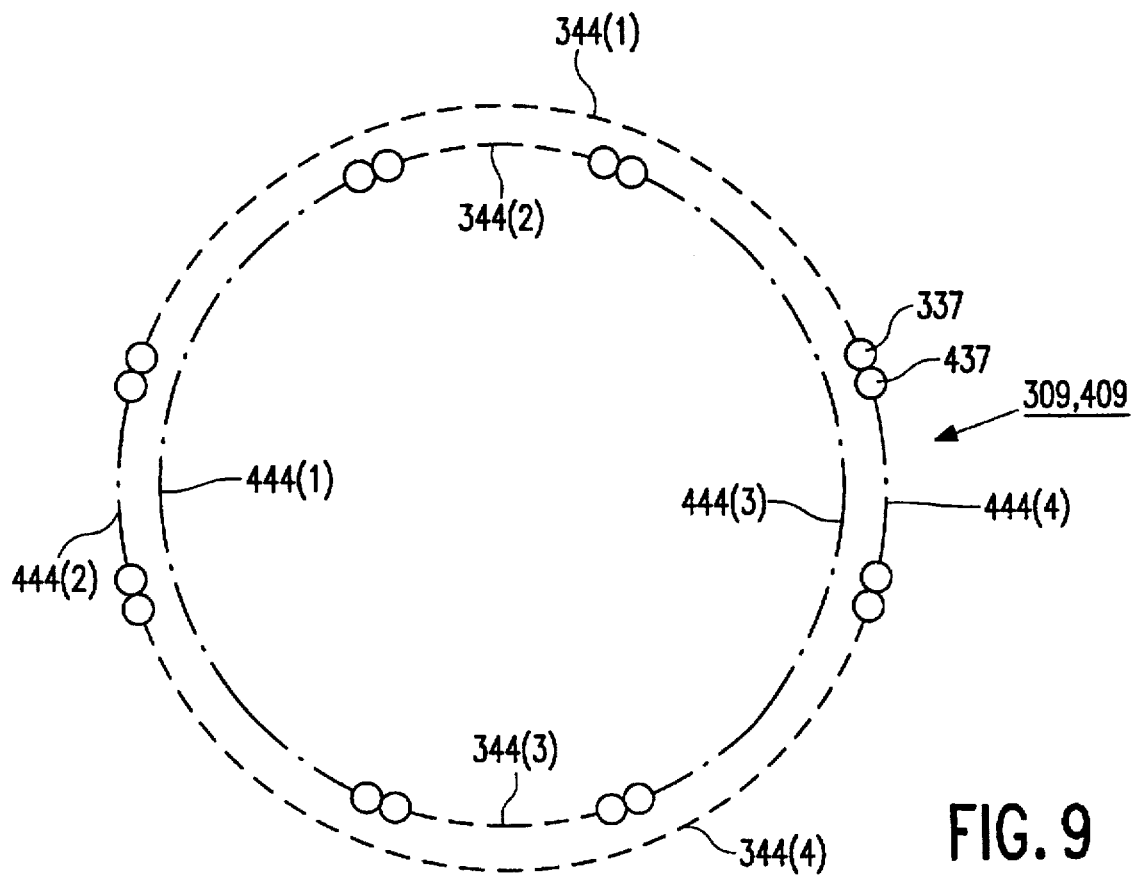
Figure 10:
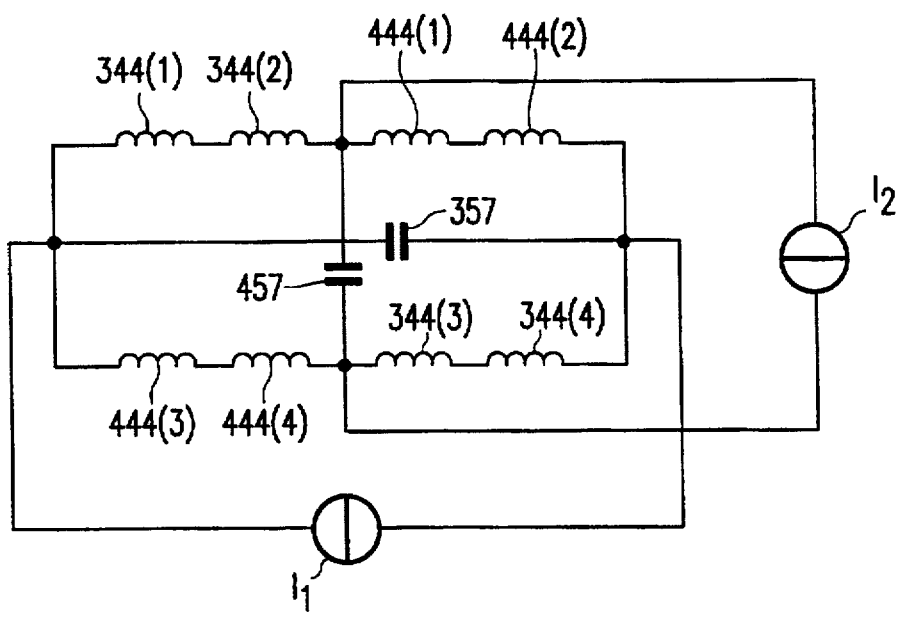

FIGS. 9 and 10 show a further embodiment of a combination of a first RF coil 309 and a second RF coil 409 constituting a quadrature coil system. In this embodiment, the first coil 309 comprises the coil elements 344(1), 344(2), 344(3) and 344(4) and the second coil comprises the coil elements 444(1), 444(2), 444(3) and 444(4). These coil elements are connected to capacitive elements 357, 457 and to two sources of RF current $I_1$ and $I_2$ as shown in FIG. 10. The current sources $I_1$ and $I_2$ provide RF currents exhibiting a phase difference of 90°. The capacitive elements 357 and 457 may comprise the parasitic capacitance between the two coils 309 and 409. They may also comprise separate capacitors. It can easily be seen that the resulting current $I_{res1}$ in the coil elements 344(1) and 344(2) is the same as the current in the coil elements 344(3) and 344(4). Similarly, the resulting current $I_{res2}$ in the coil elements 444(1) and 444(2) is the same as that in the coil elements 444(3) and 444(4). $I_{res1}$ and $I_{res2}$ exhibit a phase difference of 90° as required for a quadrature system.

Evidently, a quadrature coil system can also be formed by means of first and second RF coils of the type shown in the FIGS. 6A and 6B. In that case the first RF coil will be situated on a cylinder surface having a comparatively large diameter and the second RF coil will be arranged on a concentric cylinder surface of comparatively small diameter. The circuit diagram of the two RF coils may be the same as the circuit diagram shown in FIG. 8.

I claim:

1. A magnetic resonance apparatus comprising a mainly cylindrical RF coil which has a central axis extending in its longitudinal direction and is formed by a series connection of one or more coil elements, each composed of a number of turns of an elongate continuous electrical conductor, said coil elements together comprising a number of axial conductor elements which extend parallel to the central axis across a mainly cylindrical surface and a plurality of loop conductor segments interconnecting corresponding ends of different pairs of the axial conductor elements and forming two end conductor elements which extend around the central axis near the ends of the axial conductor elements, the axial conductor elements being distributed across the circumference of the cylinder in such a manner that they occupy more than four different axial conductor element positions relative to a zero position and that they are arranged to generate a substantially sinusoidal current density distribution as a function of the angle of their position on the circumference of the cylinder relative to the zero position, in order to enable a RF magnetic field, oriented perpendicularly to the cylinder axis, to be generated and/or received.

2. A magnetic resonance apparatus as claimed in claim 1, wherein the series connection of coil elements is connected to a capacitive element via at least one of its ends.

3. A magnetic resonance apparatus as claimed in claim 2, wherein each coil element is formed as a self-supporting sub-coil which is wound from at least one electrically conductive wire provided with an electrically insulating sheath.

4. A magnetic resonance apparatus as claimed in claim 3, wherein each coil element comprises a series connection of a plurality of coil element parts, each coil element part comprising axial conductor elements at a pair of positions at substantially equal and opposite angles relative to the zero position and being formed by one or more of said turns of the elongate electrical conductor which is chosen substantially proportional to the absolute value of the sine of said substantially equal and opposite angles.

5. A magnetic resonance apparatus as claimed in claim 3, wherein the RF coil comprises two coil elements which are diametrically arranged relative to the central axis.

6. A magnetic resonance apparatus as claimed in claim 5, wherein each coil element comprises a series connection of a plurality of coil element parts, each coil element part comprising axial conductor elements at a pair of positions at substantially equal and opposite angles relative to the zero position and being formed by one or more of said turns of the elongate electrical conductor which is chosen substantially proportional to the absolute value of the sine of said sustantially equal and opposite angles.

7. A magnetic resonance apparatus as claimed in claim 2, wherein the RF coil comprises two coil elements which are diametrically arranged relative to the central axis.

8. A magnetic resonance apparatus as claimed in claim 2, wherein each coil element comprises a series connection of a plurality of coil element parts, each coil element part comprising axial conductor elements at a pair of positions at substantially equal and opposite angles relative to the zero position and being formed by one or more of said turns of the elongate electrical conductor which is chosen substantially proportional to the absolute value of the sine of said substantially equal and opposite angles.

9. A magnetic resonance apparatus as claimed in claim 2, wherein the distance between successive axial conductor element positions in the direction of the circumference of the cylinder decreases as the absolute value of the angle between the axial conductor element position and the zero position increases.

10. A magnetic resonance apparatus as claimed in claim 1, wherein each coil element is formed as a self-supporting sub-coil which is wound from at least one electrically conductive wire provided with an electrically insulating sheath.

11. A magnetic resonance apparatus as claimed claim 3, wherein the RF coil comprises two coil elements which are diametrically arranged relative to the central axis.

12. A magnetic resonance apparatus as claimed in claim 10, wherein each coil element comprises a series connection of a plurality of coil element parts, each coil element part comprising axial conductor elements at a pair of positions at substantially equal and opposite angles relative to the zero position and being formed by one or more of said turns of the elongate electrical conductor which is chosen substantially proportional to the absolute value of the sine of said substantially equal and opposite angles.

13. A magnetic resonance apparatus as claimed in claim 3, wherein the distance between successive axial conductor element positions in the direction of the circumference of the cylinder decreases as the absolute value of the angle between the axial conductor element position and the zero position increases.

14. A magnetic resonance apparatus as claimed in claim 1, wherein the RF coil comprises two coil elements which are diametrically arranged relative to the central axis.

15. A magnetic resonance apparatus as claimed in claim 14, wherein the distance between successive axial conductor element in the direction of the circumference of the cylinder decreases as the absolute value of the angle between the axial conductor element position and the zero position increases.

16. A magnetic resonance apparatus as claimed in claim 1, wherein each coil element comprises a series connection of a plurality of coil element parts, each coil element part comprising axial conductor elements at a pair of positions at substantially equal and opposite angles relative to the zero position and being formed by one or more of said turns of the elongate electrical conductor which is chosen substantially proportional to the absolute value of the sine of said substantially equal and opposite angles.

17. A magnetic resonance apparatus as claimed in claim 16, wherein the distance between successive axial conductor element positions in the direction of the circumference of the cylinder decreases as the absolute value of the angle between the axial conductor element position and the zero position increases.

18. A magnetic resonance apparatus as claimed in claim 1, wherein the distance between successive axial conductor element positions in the direction of the circumference of the cylinder decreases as the absolute value of the angle between the axial conductor element position and the zero position increases.

19. A magnetic resonance apparatus as claimed in claim 1, wherein said RF coil comprises a first RF coil and the apparatus further comprises a second RF coil, the first and second RF coils essentially having the same construction and being concentrically arranged around the central axis in such a manner that the second RF coil has been rotated through an angle of 90° around the central axis relative to the first RF coil, the first and second RF coils being connected to respective terminals of an RF transmitter and/or receiver device arranged to supply and/or receive RF signals with a mutual phase difference of 90° in order to enable mutually perpendicularly oriented RF magnetic fields with a phase difference of 90° to be generated and/or received.

20. A magnetic resonance apparatus as claimed in claim 19, wherein the first and second RF coils have the same diameter.

* * * * *